(12) United States Patent
Kim

(10) Patent No.: US 11,310,925 B2
(45) Date of Patent: Apr. 19, 2022

(54) DISPLAY DEVICE WITH ROLLABLE DISPLAY PANEL AND OPERATION METHOD THEREOF

(71) Applicant: Samsung Display Co., LTD., Yongin-si (KR)

(72) Inventor: Sangjae Kim, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 91 days.

(21) Appl. No.: 16/821,512

(22) Filed: Mar. 17, 2020

(65) Prior Publication Data

US 2020/0383214 A1 Dec. 3, 2020

(30) Foreign Application Priority Data

May 30, 2019 (KR) .................. 10-2019-0063922

(51) Int. Cl.
*H05K 5/00* (2006.01)
*H05K 1/14* (2006.01)
*H05K 5/02* (2006.01)

(52) U.S. Cl.
CPC .......... *H05K 5/0017* (2013.01); *H05K 1/147* (2013.01); *H05K 5/0217* (2013.01); *H05K 2201/10128* (2013.01)

(58) Field of Classification Search
CPC .... G06F 1/1652; G06F 1/1624; G06F 1/1626; G06F 2203/04102; G09F 9/301; H05K 5/0017; H05K 5/0217; H05K 1/147; H05K 2201/10128; H04M 1/0268; G02F 1/133305

See application file for complete search history.

(56) References Cited

U.S. PATENT DOCUMENTS

| 10,186,681 | B2 | 1/2019 | Kang et al. | |
| 2018/0007182 | A1* | 1/2018 | Lin | G06F 1/1686 |
| 2018/0014417 | A1* | 1/2018 | Seo | H05K 1/189 |
| 2018/0103552 | A1* | 4/2018 | Seo | G06F 1/1624 |
| 2018/0205809 | A1 | 7/2018 | Luo et al. | |
| 2018/0329514 | A1 | 11/2018 | Kwon et al. | |

FOREIGN PATENT DOCUMENTS

| KR | 10-2015-0050014 | 5/2015 | |
| KR | 10-2016-0141255 | 12/2016 | |
| KR | 10-2016-0150533 | 12/2016 | |
| WO | WO-2007072234 A1 * | 6/2007 | G06F 1/1652 |

* cited by examiner

*Primary Examiner* — James Wu
(74) *Attorney, Agent, or Firm* — Kile Park Reed & Houtteman PLLC

(57) ABSTRACT

A display device includes a rollable display panel having a first end portion and a second end portion spaced apart from the first end portion, a first roller configured to roll the first end portion, and a second roller configured to roll the second end portion. The second end portion of the rollable display panel may include a transmissive region which external light may pass through. An operation method of the display device includes determining an operation mode, rolling the rollable display panel in a first rotation direction so that the transmissive region is not exposed outside in a first display mode, rolling the rollable display panel in a second rotation direction so that the transmissive region is exposed outside in a second display mode, and displaying an image in a display region exposed outside.

18 Claims, 14 Drawing Sheets

DISPLAY DEVICE WITH ROLLABLE DISPLAY PANEL AND OPERATION METHOD THEREOF

CROSS-REFERENCE TO RELATED APPLICATION

This application claims priority to and benefits of Korean Patent Application No. 10-2019-0063922 under 35 U.S.C. § 119, filed in the Korean Intellectual Property Office on May 30, 2019, the entire contents of which are incorporated herein by reference.

BACKGROUND

Technical Field

The disclosure herein relates to a display device, and more particularly, to a display device including a rollable display panel.

Description of the Related Art

A multimedia device such as a television, a mobile phone, a tablet computer, a navigation device, or a game machine may include a display device for providing a user with an image.

As display device technology continues to develop, various types of display devices have been proposed. For example, flexible display devices that may be folded or rolled are under development. Shapes of flexible display devices may be changeable and therefore flexible display devices may be easier to carry and thus may improve user convenience.

Portable electronic devices are becoming widespread, and the functions thereof are getting more and more diverse. A user may prefer a display device having a display region of a larger area and a non-display region of a smaller area.

Various types of display devices are being developed to reduce the area of a non-display region.

It is to be understood that this background section is, in part, intended to provide useful background for understanding the technology. However, this background section may also include ideas, concepts, or recognitions that were not part of what was known or appreciated by those skilled in the pertinent art prior to a corresponding effective filing date of the subject matter disclosed herein.

SUMMARY

Embodiments of the invention may be provided regarding a display device having a relatively wide display region and a relatively narrow non-display region.

An embodiment of the invention may provide a display device capable of preventing deterioration of a display panel.

An embodiment may provide a display device including a battery in a roller.

An embodiment provides a display device that may include a rollable display panel including a first end portion and a second end portion spaced apart from the first end portion. The display device may include a first roller configured to roll the first end portion, and a second roller configured to roll the second end portion. The second end portion of the rollable display panel may include a transmissive region which external light passes through.

In an embodiment, the second end portion of the rollable display panel may be rolled by the second roller in a first display mode, and the transmissive region of the second end portion may not be exposed outside the display device in the first display mode.

In an embodiment, the first end portion of the rollable display panel may be rolled by the first roller in a second display mode, and the transmissive region of the second end portion may be exposed to the outside in the second display mode.

In an embodiment, the display device may further include an electronic part, wherein the electronic part and the rollable display panel may overlap each other. The transmissive region and the electronic part may overlap each other in the second display mode.

In an embodiment, the second display mode may be an operation mode of the electronic part.

In an embodiment, the electronic part may include at least one of a light emitting element or a photo sensor.

In an embodiment, the rollable display panel may include pixels, wherein the transmissive region does not include any of the pixels.

In an embodiment, the display device may further include a case configured to accommodate the rollable display panel, the first roller, and the second roller.

In an embodiment, the display device may further include an electronic part disposed inside the case, wherein the electronic part and the rollable display panel may overlap each other.

In an embodiment, the rollable display panel may include a display region exposed in a front direction of the case and a non-display region adjacent to the display region.

In an embodiment, the first roller and the second roller may rotate in a clockwise direction or a counterclockwise direction to move the rollable display panel in the clockwise direction or the counterclockwise direction.

In an embodiment, the first roller and the second roller may rotate in the clockwise direction or the counterclockwise direction within a range in which the transmissive region of the second end portion may not be exposed outside the display device.

In an embodiment, the first roller and the second roller may rotate in the clockwise direction or the counterclockwise direction in a non-light emitting mode of the rollable display panel.

In an embodiment, a position of a display region in the rollable display panel may change in accordance with a rotation direction and a rotation distance when the first roller and the second roller rotate in the clockwise direction or the counterclockwise direction.

In an embodiment, a first radius of rotation of the first roller and a second radius of rotation of the second roller may be equal to each other.

In an embodiment, the display device may further include a power supply disposed inside at least one of the first roller or the second roller.

In an embodiment, the display device may further include a first board connected to the first end portion of the rollable display panel and a second board electrically connected to the first board.

In an embodiment, the display device may further include a battery disposed inside at least one of the first roller and the second roller.

Another embodiment provides an operation method of a display device including a rollable display panel including a first end portion and a second end portion which may be spaced apart from the first end portion and may have a transmissive region. The operation method may include determining an operation mode, and rolling the rollable display panel in a first rotation direction so that the transmissive region may not be exposed outside the display device in a first display mode. The operation method may include rolling the rollable display panel in a second rotation direction so that the transmissive region may be exposed outside the display device in a second display mode, and displaying an image in a display region of the rollable display panel, the display region being exposed outside the display device.

In an embodiment, the display device may further include an electronic part, wherein the electronic part and the rollable display panel may be overlap each other. The second display mode may be an operation mode of the electronic part.

In an embodiment, the operation method may further include rotating the rollable display panel in the first rotation direction or the second rotation direction in a non-light emitting mode of the rollable display panel.

An embodiment of the invention provides a display device that may include a rollable display panel including a first end portion and a second end portion spaced apart from the first end portion. The display device may include a first roller configured to roll the first end portion. The display device may include a second roller configured to roll the second end portion. The display device may include a battery disposed inside at least one of the first roller and the second roller.

BRIEF DESCRIPTION OF THE FIGURES

The accompanying drawings, which are included to provide a further understanding of the invention, and are incorporated in and constitute a part of this specification, illustrate embodiments of the invention, and together with the description of the embodiments.

DETAILED DESCRIPTION OF THE EMBODIMENTS

Figure 1:
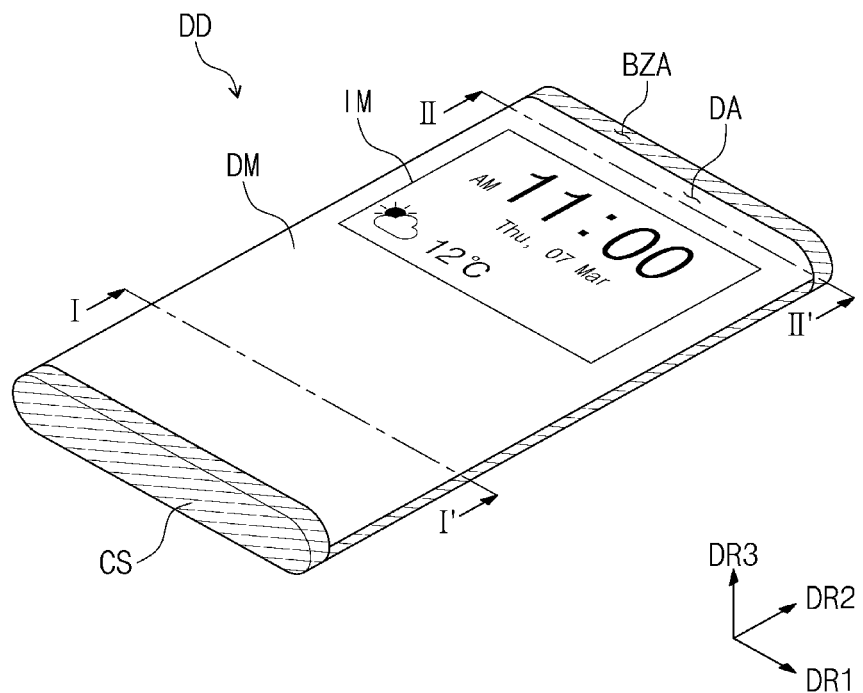
FIG. 1 is a perspective view of a display device according to an embodiment.

Reference will now be made to embodiments illustrated in the accompanying drawings, wherein like reference numerals refer to like elements throughout. It will be understood that when an element or layer is referred to as being "on", "connected to" or "coupled to" another element or layer, it can be directly on, connected or coupled to the other element or layer, or intervening elements or layers may be present.

In the figures, the thicknesses, ratios and dimensions of elements may be exaggerated for effective description of the technical contents.

As used herein, the term "and/or" may include any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention. As used herein, the singular forms, "a", "an" and "the" are intended to include the plural forms as well, unless the context clearly indicates otherwise.

Spatially relative terms, such as "beneath", "below", "lower", "above", and "upper", may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include" and/or "have", when used in this specification, specify the presence of stated features, integers, steps, operations, elements, and/or components, but do not preclude the presence or addition of one or more other features, integers, steps, operations, elements, components, and/or groups thereof "About" or "approximately" or "substantially" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

The terms "overlap" or "overlapped" mean that a first object may be above or below or to a side of a second object, and vice versa. The term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

FIG. 1 is a perspective view of a display device DD according to an embodiment.

Referring to FIG. 1, the display device DD according to an embodiment may include a display part DM and a case CS accommodating the display part DM. The display part DM may be exposed to the outside through an opening defined in an upper portion of the case CS.

Hereinafter, a direction intersecting a first direction DR1 may be defined as a second direction DR2. A direction substantially perpendicular to a plane defined by the first and second directions DR1 and DR2 may be defined as a third direction DR3.

The display device DD may be applied to a large-sized electronic device such as a television and a monitor, and a medium-sized and small-sized electronic device such as a mobile phone, a tablet computer, a car navigation device, a game machine, and a smart watch.

The display device DD may include, when viewed in a plane along the third direction DR3, a display region DA in which an image may be displayed, and a bezel region BZA adjacent to the display region DA. The bezel region BZA may be a region where no image may be displayed, and may be a portion of the case CS. In an embodiment, the display device DD may include a partially curved shape. As a result, a portion of the display region DA may have a curved shape.

Figure 2:
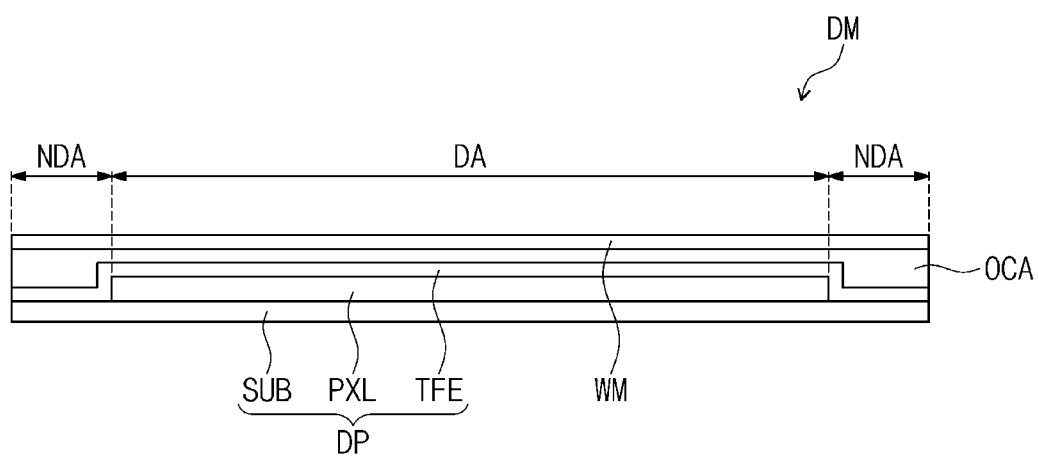
FIG. 2 is a schematic cross-sectional view of a display part according to an embodiment.

FIG. 2 is a schematic cross-sectional view of a display part of a display device according to an embodiment, for example, the display part DM illustrated in FIG. 1.

Referring to FIG. 2, the display part DM may include a display panel DP, a window member WM, and an adhesive OCA disposed between the display panel DP and the window member WM.

The display panel DP may be an organic light emitting display panel. However, the display panel DP is not limited thereto, and various display panels capable of displaying an image such as a liquid crystal display panel, an electrowetting display panel, and an electrophoretic display panel may be used as the display panel DP. The display panel DP may be a flexible display panel.

The display panel DP may include a substrate SUB, a pixel layer PXL disposed on the substrate SUB, and a thin film encapsulation layer TFE disposed on the substrate SUB so as to cover the pixel layer PXL. The substrate SUB may be a transparent substrate and may include a flexible plastic substrate. For example, the substrate SUB may include polyimide (PI).

The substrate SUB may include a display region DA and a non-display region NDA at the periphery of the display region DA. The pixel layer PXL may be disposed at the display region DA. The pixel layer PXL may include pixels and each of the pixels may include a light emitting element. The non-display region NDA may correspond to the bezel region BZA of the display device DD illustrated in FIG. 1.

The thin film encapsulation layer TFE may include at least two inorganic layers and an organic layer disposed between the inorganic layers. The inorganic layers may include an inorganic material and may protect the pixel layer PXL from moisture and/or oxygen. The organic layer may include an organic material and may protect the pixel layer PXL from foreign matter such as dust particles.

Although not illustrated in the figure, the display panel DP may further include, on the thin film encapsulation layer TFE, a touch sensing unit for sensing an external input (e.g., a user's hand or a touch pen). In another embodiment, a touch sensing unit may be manufactured as a touch panel separate from the display panel DP and attached to the display panel DP by an adhesive.

The window member WM may protect the display panel DP from scratches and impact from the outside. The window member WM may be attached to the display panel DP by the adhesive OCA. The adhesive OCA may include an optically clear adhesive. An image generated by the display panel DP may be provided to a user through the window member WM.

Figure 3:
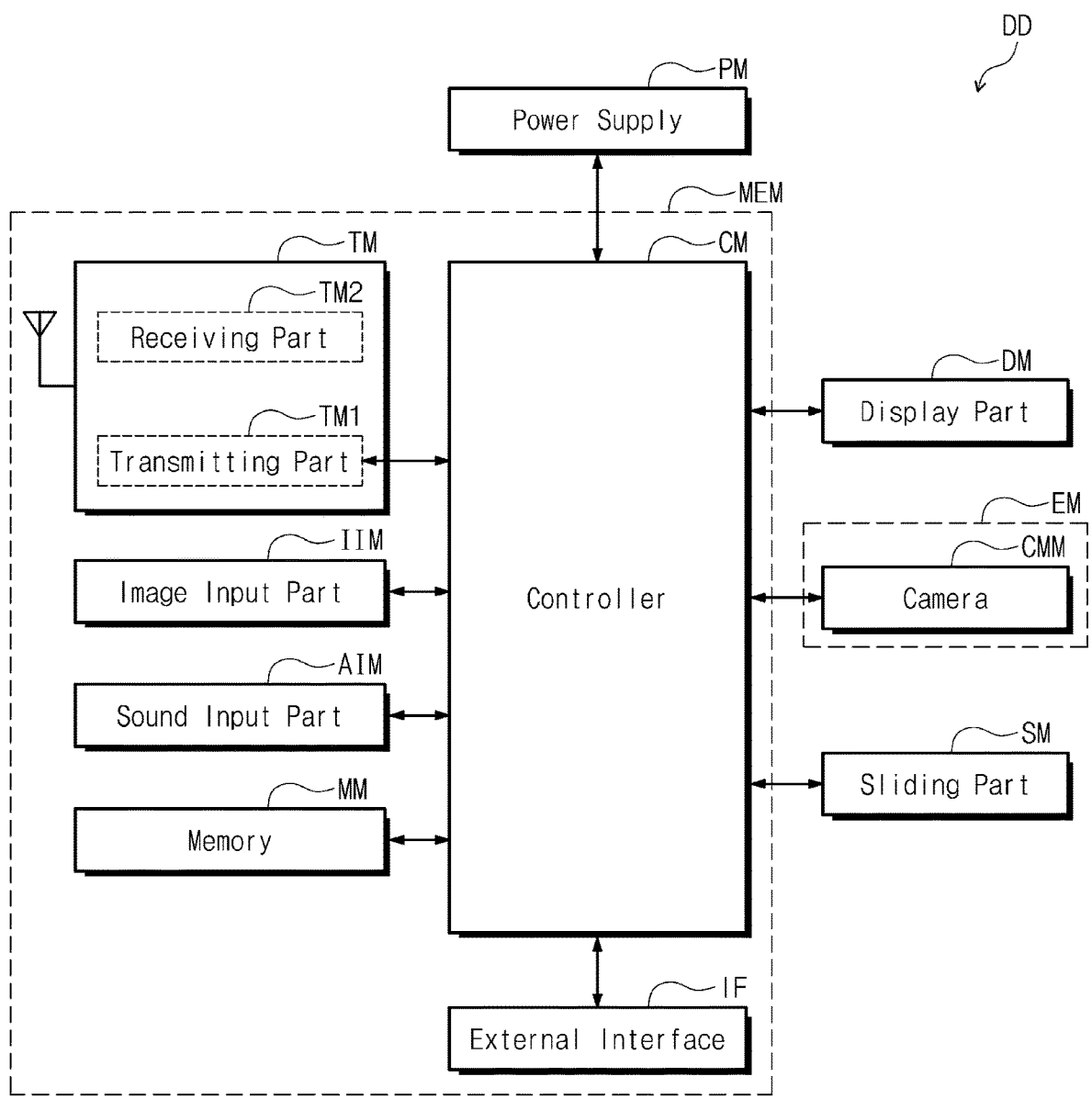
FIG. 3 is a block diagram of the display device illustrated in FIG. 1.

FIG. 3 is a block diagram of the display device DD illustrated in FIG. 1.

Referring to FIG. 3, the display device DD may include the display part DM, a power supply PM, a main part MEM, a sliding part SM, and an electronic part EM. The display part DM, the power supply PM, the main part MEM, the sliding part SM, and the electronic part EM may be electrically connected to each other.

The power supply PM may supply power required for the overall operation of the display device DD. The power supply PM may include a battery.

The main part MEM and the electronic part EM may include various functional components or modules for operating the display device DD. The main part MEM may be mounted on a circuit board electrically connected to the display part DM. In other embodiments, the main part MEM may be mounted on a separate board to be electrically connected through a connector (not illustrated) or the like.

The main part MEM may include a controller CM, a wireless communication part TM, an image input part IIM, a sound input part AIM, memory MM, and an external interface IF. The controller CM may control the overall operation of the display device DD. The controller CM may be a microprocessor. For example, the controller CM may activate or deactivate the display part DM. The controller CM may control other components or modules such as the image input part IIM and the sound input part AIM.

The wireless communication part TM may transmit/receive a radio signal to/from other terminals by using a Bluetooth or Wi-Fi channel. The wireless communication part TM may transmit/receive a voice signal by using a general communication channel. The wireless communication part TM may include a transmitting part TM1 for modulating and transmitting a signal to be transmitted, and a receiving part TM2 for demodulating a received signal.

The image input part IIM may process an image signal and convert the processed image signal into image data that may be displayed on the display part DM. The sound input part AIM may receive an external sound signal using a microphone in a recording mode, a voice recognition mode, or the like, and convert the received external sound signal into electrical voice data.

The external interface IF may serve as an interface to which an external charger, a wired/wireless data port, a card socket (e.g., a memory card and a SIM/UIM card), and the like may be connected.

The electronic part EM may include a camera CMM. The camera CMM may capture an external image. The electronic part EM may further include a light emitter, a sound output, a light sensor, a heat sensor and the like in addition to the camera CMM. The electronic part EM may be mounted on the circuit board together with the main part MEM. In other embodiments, the electronic part EM may be mounted on a separate board to be electrically connected to the main part MEM through a connector (not illustrated) or the like.

The sliding part SM may include physical and/or electrical components for slidably moving, inside the case CS (see FIG. 1), the display panel DP (see FIG. 2) of the display part DM. The sliding part SM will be described in detail.

Figure 4:
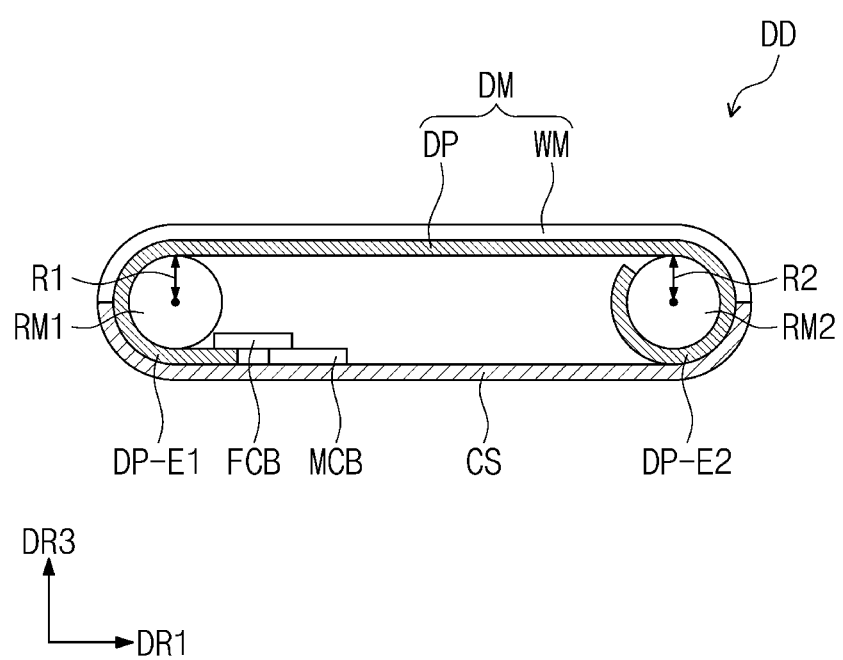
FIG. 4 is a schematic cross-sectional view taken along line I-I' of the display device illustrated in FIG. 1 according to an embodiment.

FIG. 4 is a schematic cross-sectional view taken along line I-I' of the display device DD illustrated in FIG. 1 according to an embodiment.

Referring to FIG. 4, the display device DD may include the display part DM, a first circuit board FCB, a second circuit board MCB, the case CS, a first roller RM1, and a second roller RM2. As illustrated in FIGS. 2 and 4, the display part DM may include the display panel DP and the window member WM.

The display panel DP may include a first end portion DP-E1 and a second end portion DP-E2. One side of the first end portion DP-E1 of the display panel DP may be connected to the first circuit board FCB. The second circuit board MCB may be connected to the first circuit board FCB. The first circuit board FCB may electrically connect the second circuit board MCB and the display panel DP. An integrated circuit (not illustrated) for driving the display panel DP may be mounted on the first circuit board FCB. The main part MEM illustrated in FIG. 3 may be mounted on the second circuit board MCB. Although not illustrated separately, passive elements and active elements may be mounted on the second circuit board MCB. The second circuit board MCB may be a rigid circuit board or a flexible circuit board. The first circuit board FCB may be a flexible circuit board. Although the first circuit board FCB and the second circuit board MCB are illustrated and described as being connected to the first end portion DP-E1 of the display panel DP in an embodiment, the first circuit board FCB and the second circuit board MCB may be connected to the second end portion DP-E2 of the display panel DP in other embodiments.

The first end portion DP-E1 and the second end portion DP-E2 of the display panel DP may respectively correspond to the first roller RM1 and the second roller RM2. The display panel DP may be a rollable display panel. The first end portion DP-E1 and the second end portion DP-E2 of the display panel DP may respectively be rolled by the first roller RM1 and the second roller RM2.

The first roller RM1 and the second roller RM2 may be included in the sliding part SM (see FIG. 3). The first roller RM1 and the second roller RM2 may rotate in a clockwise direction (or a first rotation direction) or a counterclockwise direction (or a second rotation direction) according to the control of the controller CM (see FIG. 3). The first roller RM1 and the second roller RM2 may roll or unroll the display panel DP that may be rollable. The controller CM may determine an operation mode of the display device DD and set a rotation direction and a rotation distance of the first roller RM1 and the second roller RM2 in accordance with the determined operation mode.

The first roller RM1 may have a first radius of rotation R1 and the second roller RM2 may have a second radius of rotation R2. In an embodiment, the first radius of rotation R1 of the first roller RM1 and the second radius of rotation R2 of the second roller RM2 may be the same, but an embodiment thereof is not limited thereto. The first radius of rotation R1 of the first roller RM1 and the second radius of rotation R2 of the second roller RM2 may be different from each other depending on the shape of the display device DD.

As shown in FIG. 4, the first roller RM1 and the second roller RM2 may rotate in the clockwise direction and thus the second end portion DP-E2 of the display panel DP may be rolled by the second roller RM2. A portion of the first end portion DP-E1 of the display panel DP may be exposed to the outside to display an image. As shown in FIG. 4, the second end portion DP-E2 of the display panel DP may be rolled to wrap the second roller RM2 when the first roller RM1 and the second roller RM2 rotate in the clockwise direction. But, the embodiments thereof are not limited thereto. For example, the second end portion DP-E2 of the display panel DP may be housed inside the case CS in an unrolled state.

Figure 5:
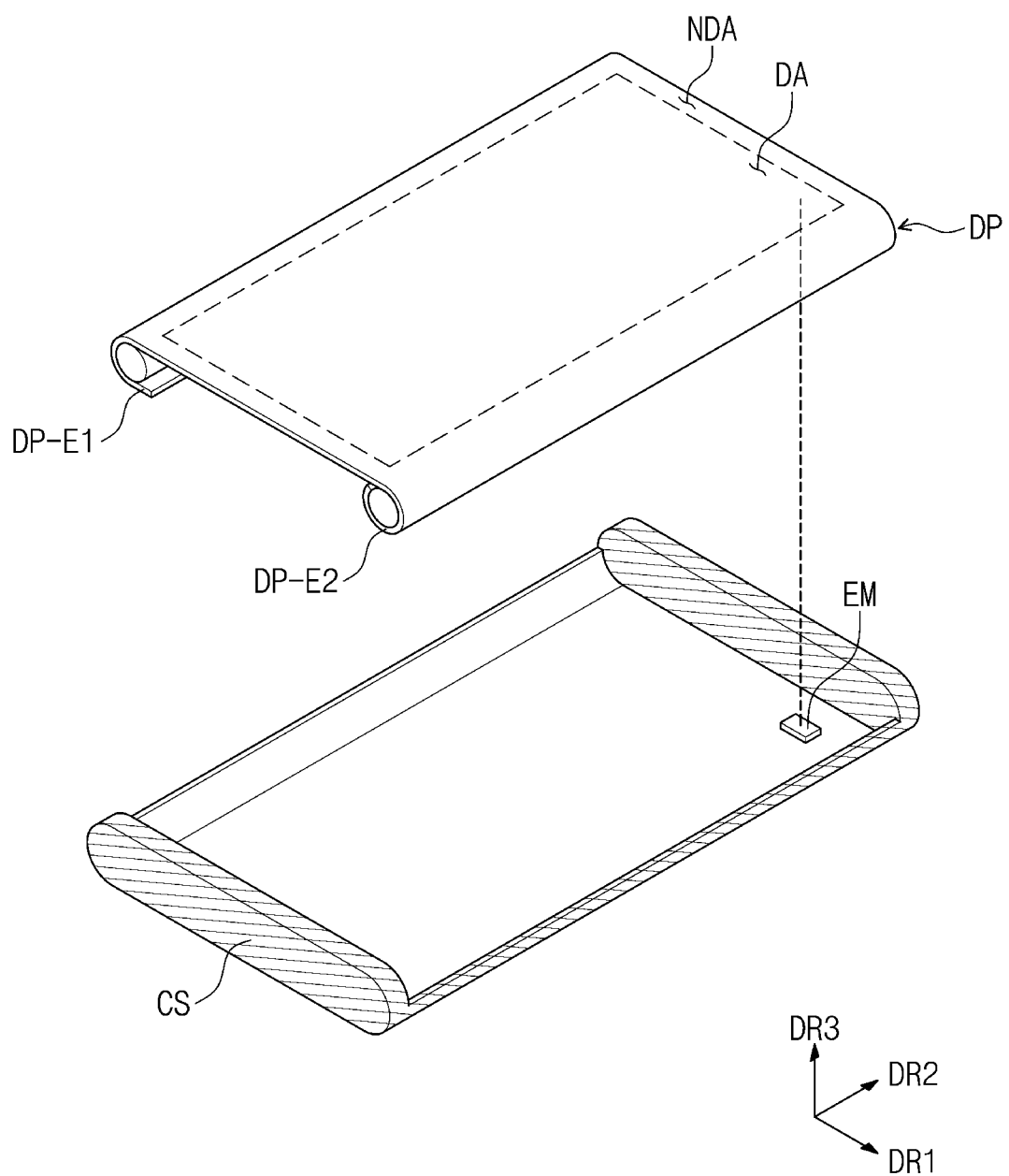
FIG. 5 is a perspective view of some components of the display device illustrated in FIG. 4.

FIG. 5 is a perspective view of some components of the display device DD illustrated in FIG. 4.

Referring to FIGS. 4 and 5, the electronic part EM may be disposed in a region of the case CS. The display region DA may be maximized when the first roller RM1 and the second roller RM2 rotate in the clockwise direction and thus the first end portion DP-E1 of the display panel DP may be exposed to the outside.

The electronic part EM and the display region DA may overlap each other in a state in which the first roller RM1 and the second roller RM2 have rotated in the clockwise direction. A display region DA of the display panel DP may be an opaque region that may not transmit external light. When the electronic part EM includes the camera CMM (see FIG. 3), the camera CMM may not operate if overlapped by the display region DA. In a first display mode (for example, an image display mode such as when playing a game or watching a movie), the area of the display region DA of the display panel DP may be maximized and the camera CMM may not operate.

Figure 6:
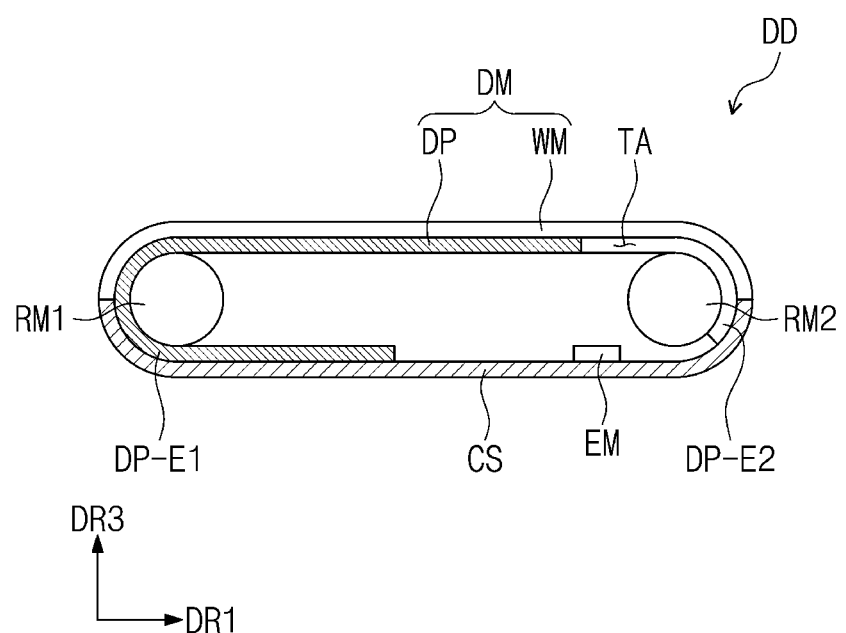
FIG. 6 is a schematic cross-sectional view taken along line II-II' of the display device illustrated in FIG. 1.

FIG. 6 is a schematic cross-sectional view taken along line II-II' of the display device DD illustrated in FIG. 1.

As shown in FIG. 6, the first roller RM1 and the second roller RM2 may rotate in the counterclockwise direction and thus the first end portion DP-E1 of the display panel DP may be accommodated inside the case CS. A portion of the second end portion DP-E2 of the display panel DP may be exposed to the outside to display an image. The second end portion DP-E2 of the display panel DP may include a transparent region TA. The transparent region TA may transmit external light and is also referred to herein as a transmissive region. The transparent region TA may include the substrate SUB and the thin film encapsulation layer TFE (see FIG. 2). The transparent region TA may not include a pixel layer. Accordingly, the transparent region TA may be substantially transparent. An image may not be displayed in the transparent region TA because the transparent region TA may not include a pixel layer.

Because the length in the second direction DR2 of each of the first circuit board FCB and the second circuit board MCB (see FIG. 4) is smaller than the length in the second direction DR2 of the display panel DP, the first circuit board FCB and the second circuit board MCB are not illustrated in FIG. 6.

Figure 7:
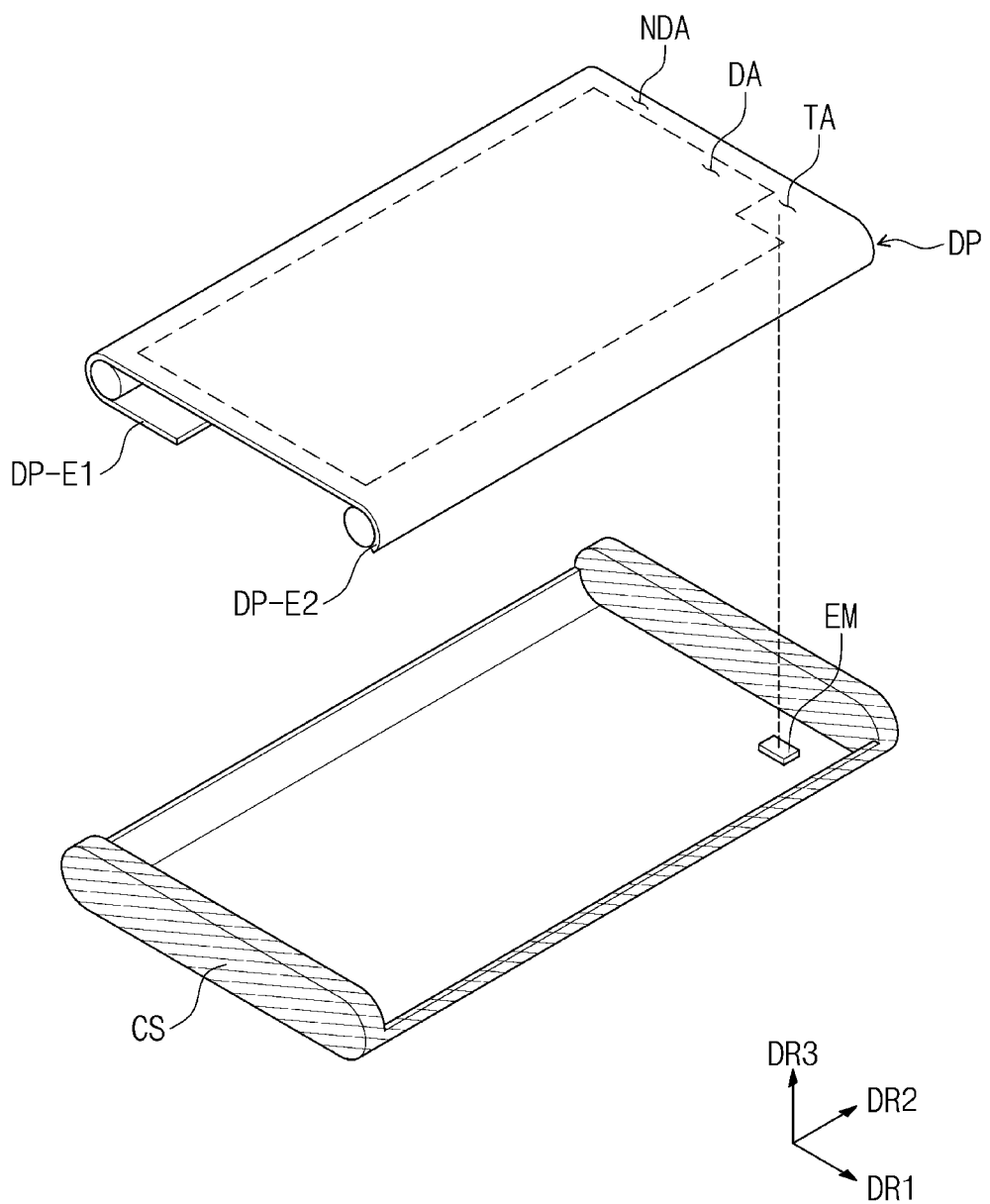
FIG. 7 is a perspective view of some components of the display device illustrated in FIG. 6.

FIG. 7 is a perspective view of some components of the display device DD illustrated in FIG. 6.

Referring to FIGS. 6 and 7, the electronic part EM may be disposed in a region of the case CS. When the first roller RM1 and the second roller RM2 have rotated in the counterclockwise direction and thus the transparent region TA of the display panel DP may be exposed to the outside, the electronic part EM and the transparent region TA may overlap each other. When the electronic part EM includes the camera CMM (see FIG. 3), the camera CMM may take an external image through the transparent region TA of the display panel DP. In a second display mode (for example, a camera operation mode such as when taking a picture/video), the area of the display region DA of the display panel DP may be reduced, and the camera CMM may operate.

In this specification, the transparent region TA may be illustrated and described as being disposed at an upper end of the second end portion DP-E2 of the display panel DP, but an embodiment thereof is not limited thereto. The transparent region TA may be disposed at any position on the display panel DP that may overlap the electronic part EM. The transparent region TA may be disposed at a position where the transparent region TA may be rolled by either the first roller RM1 or the second roller RM2 to maximize the area of the display region DA of the display panel DP in the first display mode.

Figure 8:
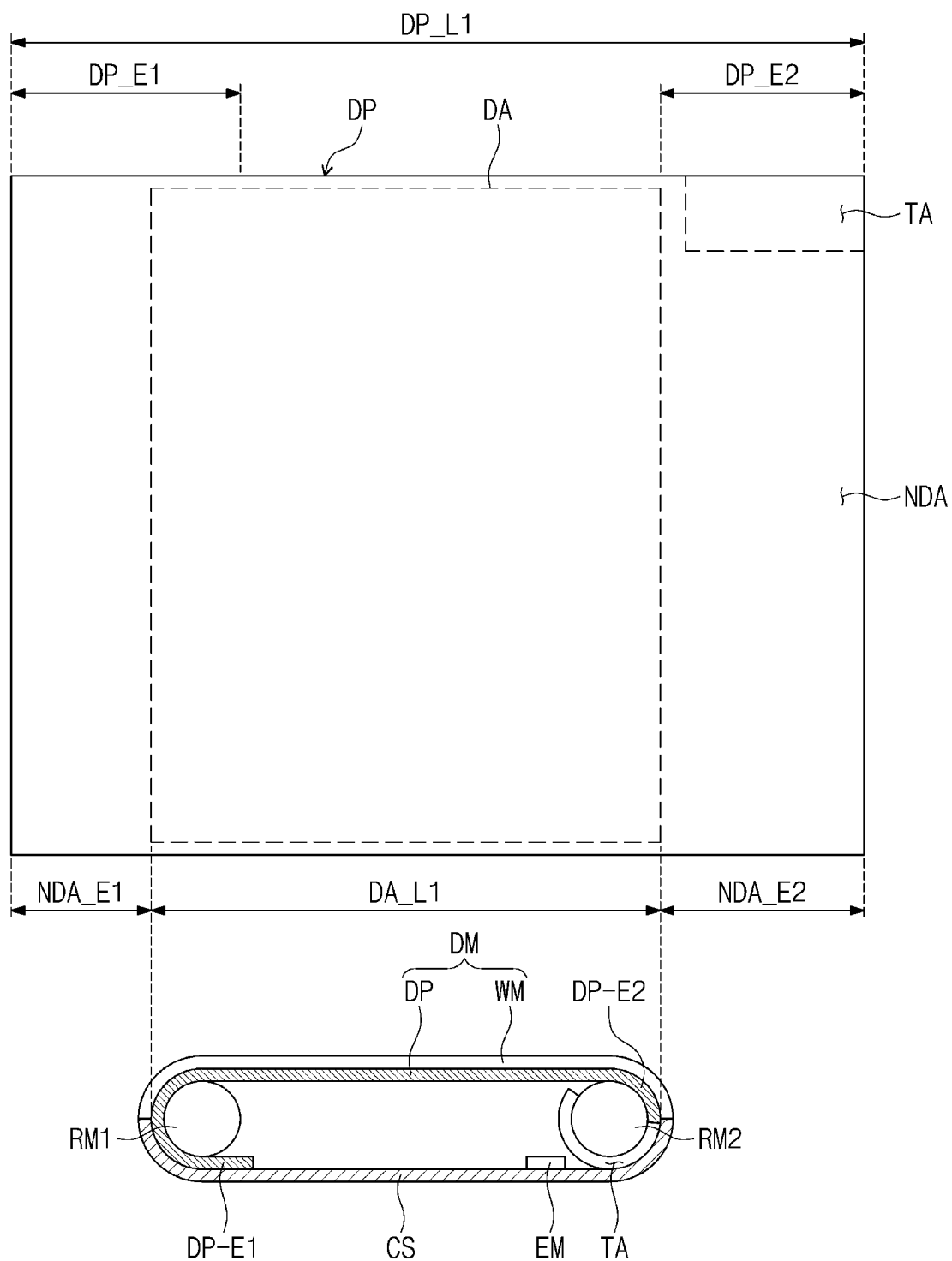
FIG. 8 illustrates a display panel in a first display mode according to an embodiment.

FIG. 8 illustrates a display panel in a first display mode according to an embodiment. The display panel DP may include the display region DA, the non-display region NDA, and the transparent region TA.

A portion of the non-display region NDA may be the transparent region TA.

A length DA_L1 of the display region DA in the first direction DR1 may be smaller than a length DP_L1 of the display panel DP in the first direction DR1.

As shown in FIG. 8, the first roller RM1 and the second roller RM2 may rotate in the clockwise direction in the first display mode and thus the second end portion DP-E2 of the display panel DP may be rolled by the second roller RM2. A portion of the first end portion DP-E1 of the display panel DP may be exposed to the outside to display an image.

The non-display region NDA may include a first non-display region NDA-E1 of the first end portion DP-E1 and a second non-display region NDA-E2 of the second end portion DP-E2. The first non-display region NDA-E1 and the second non-display region NDA-E2 may be accommodated inside the case CS by the first roller RM1 and the second roller RM2, respectively. The display region DA may be maximized as the transparent region TA in the second non-display region NDA-E2 may be accommodated inside the case CS.

Figure 9:
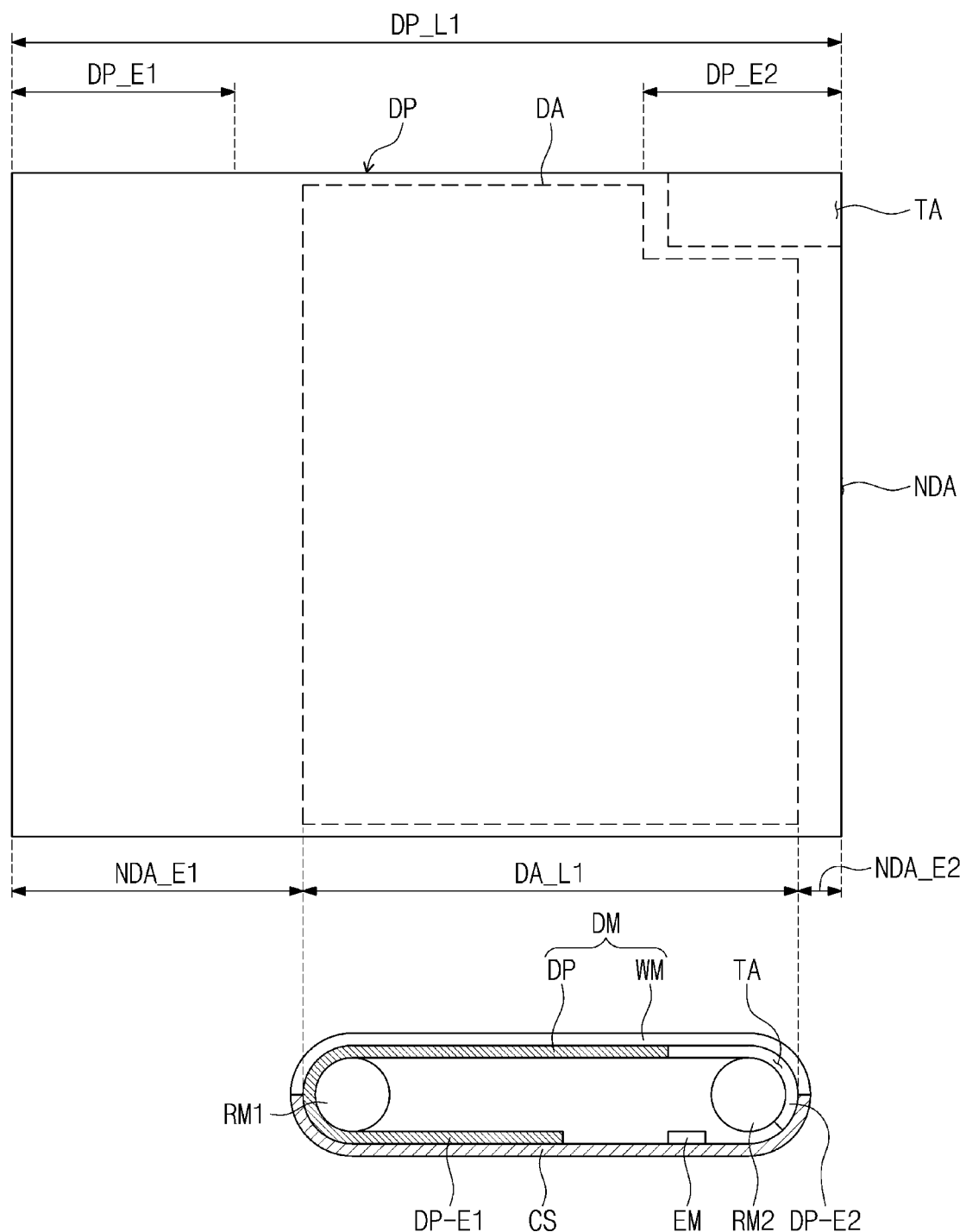
FIG. 9 illustrates a display panel in a second display mode according to an embodiment.

FIG. 9 illustrates a display panel in a second display mode according to an embodiment. The display panel DP may include the display region DA, the non-display region NDA, and the transparent region TA.

As shown in FIG. 9, the first roller RM1 and the second roller RM2 may rotate in the counterclockwise direction in the second display mode and thus the first end portion DP-E1 of the display panel DP may be rolled by the first roller RM1. A portion of the second end portion DP-E2 of the display panel DP may be exposed to the outside to display an image. The transparent region TA may be exposed to the outside.

Accordingly, in the second display mode (for example, a camera operation mode such as when taking a picture/video), the area of the display region DA of the display panel DP may be reduced, and the camera CMM may operate.

Figure 10:
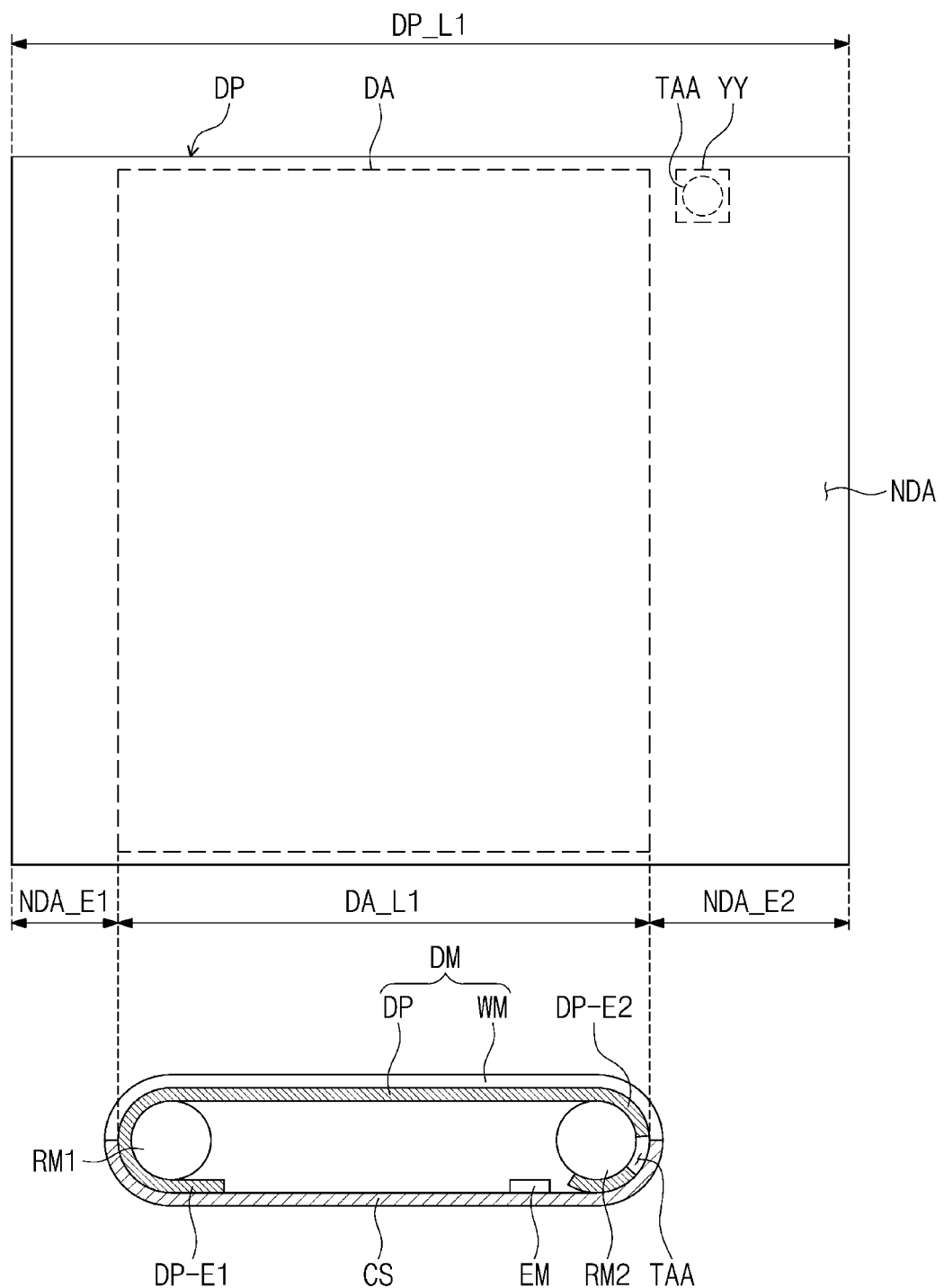
FIG. 10 illustrates a display panel in a first display mode according to an embodiment.
Figure 11:
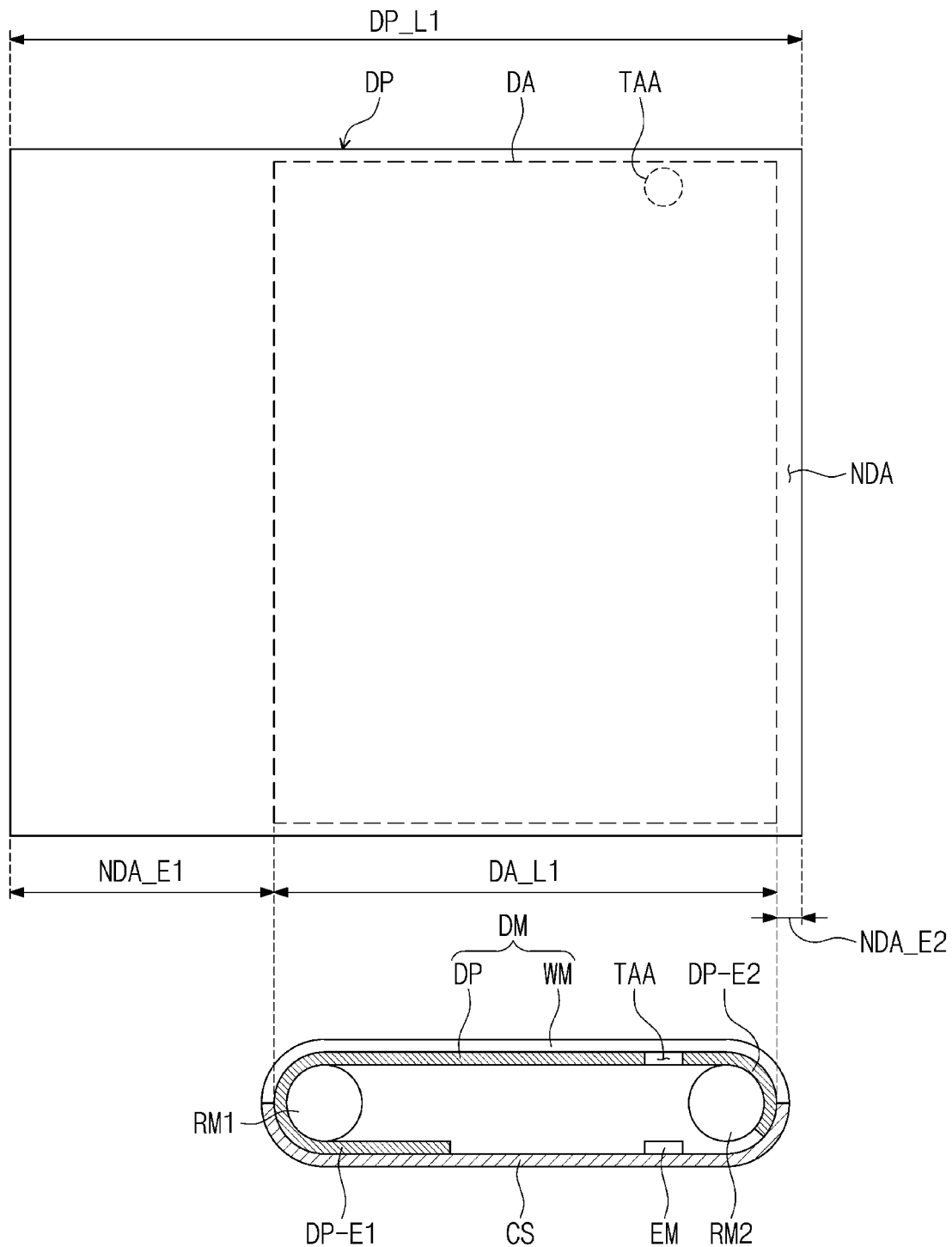
FIG. 11 illustrates a display panel in a second display mode according to an embodiment.

FIG. 10 illustrates a display panel in the first display mode according to an embodiment. The display panel DP may include the display region DA, the non-display region NDA, and a transparent region TAA. FIG. 11 illustrates a display panel in the second display mode according to an embodiment. The display panel DP may include the display region DA, the non-display region NDA, and the transparent region TAA.

The display panel DP of the first display mode illustrated in FIG. 10 is similar to the display panel DP of the first display mode illustrated in FIG. 8, and the display panel DP of the second display mode illustrated in FIG. 11 is similar to the display panel DP of the second display mode illustrated in FIG. 9.

A transparent region TAA illustrated in FIGS. 10 and 11 may have a circular shape. However, the embodiments thereof are not limited thereto. In other embodiments, the transparent region TAA may have a shape, corresponding to the shape of the electronic part EM, of a polygon, an ellipse, or a closed line including a curved line at least partially, or may have a shape including partially disconnected patterns. But, the embodiments thereof are not limited to the above mentioned shapes.

The transparent region TAA illustrated in FIGS. 10 and 11 may have an area smaller than that of the transparent region TA illustrated in FIGS. 8 and 9 so that the length of the second end portion DP-E2 of a display panel DP may be reduced or minimized.

Figure 12:
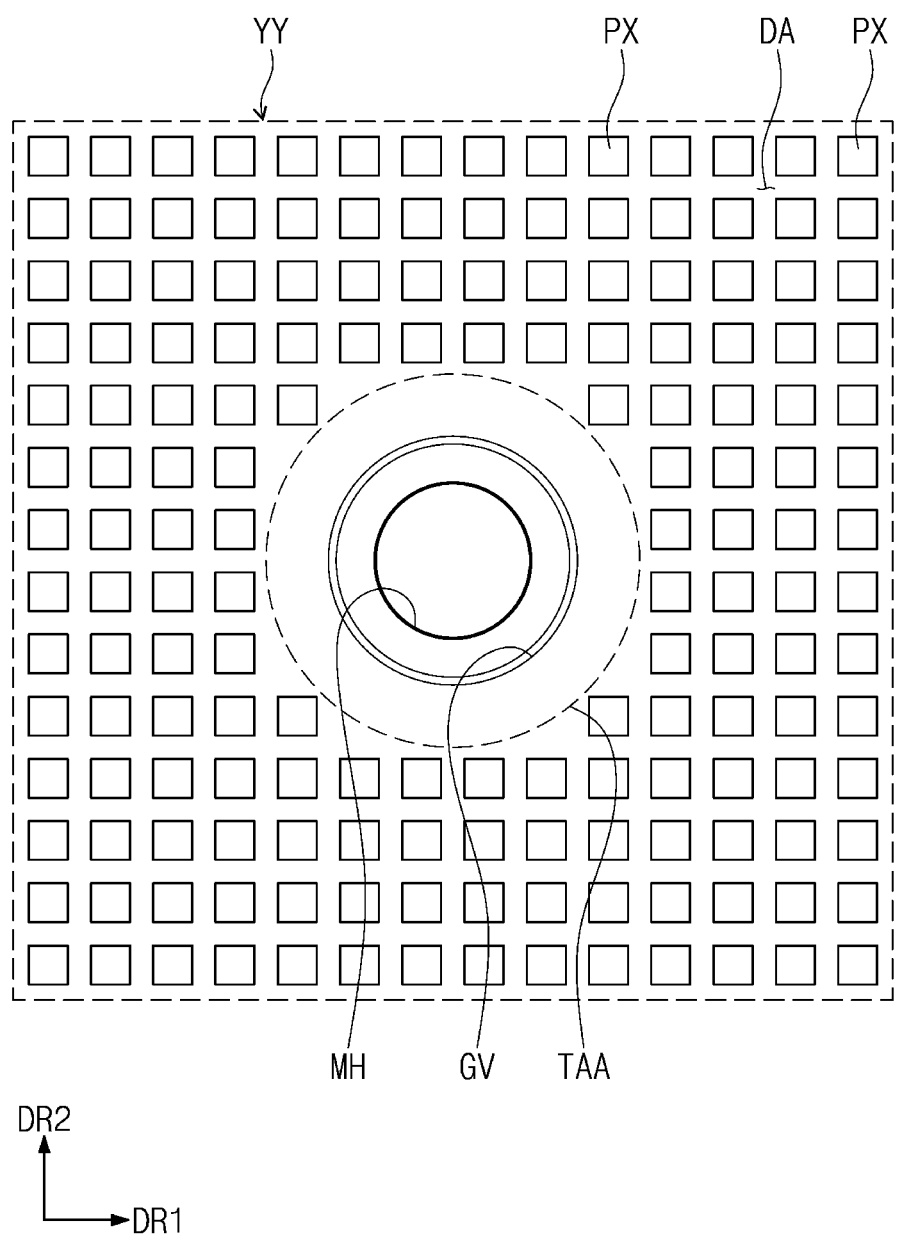
FIG. 12 is an enlarged plan view of region YY including a transparent region TAA of a display panel illustrated in FIG. 10.

FIG. 12 is an enlarged plan view of region YY including the transparent region TAA of the display panel DP illustrated in FIG. 10.

Referring to FIG. 12, pixels PX may be arranged in the region YY of the display panel DP. The pixels PX may not be arranged in the transparent region TAA in the region YY.

A hole MH may be defined inside the transparent region TAA. In other words, an opening (or an opening area) defined from a bottom surface of the display panel DP to a top surface of the display panel DP may correspond to the hole MH. In this embodiment, a bottom surface of the substrate SUB (illustrated in FIG. 2) may correspond to the bottom surface of the display panel DP, and a top surface of the thin film encapsulation layer TFE (illustrated in FIG. 2) may correspond to the top surface of the display panel DP.

A recess pattern GV may be formed or disposed around the hole MH. Unlike the hole MH, the recess pattern GV may not pass through the display panel DP. The recess pattern GV may be defined along the edge of the hole MH. In this embodiment, the recess pattern GV is illustrated as a closed line surrounding the hole MH, and illustrated as a circular shape similar to that of the hole MH. However, the embodiments thereof are not limited thereto. The recess pattern GV may have a shape different from that of the hole MH, may have a shape of a polygon, an ellipse, or a closed line including a curved line at least partially, or may have a shape including partially disconnected patterns. But, the embodiments thereof are not limited to the above mentioned shapes.

Figure 13:
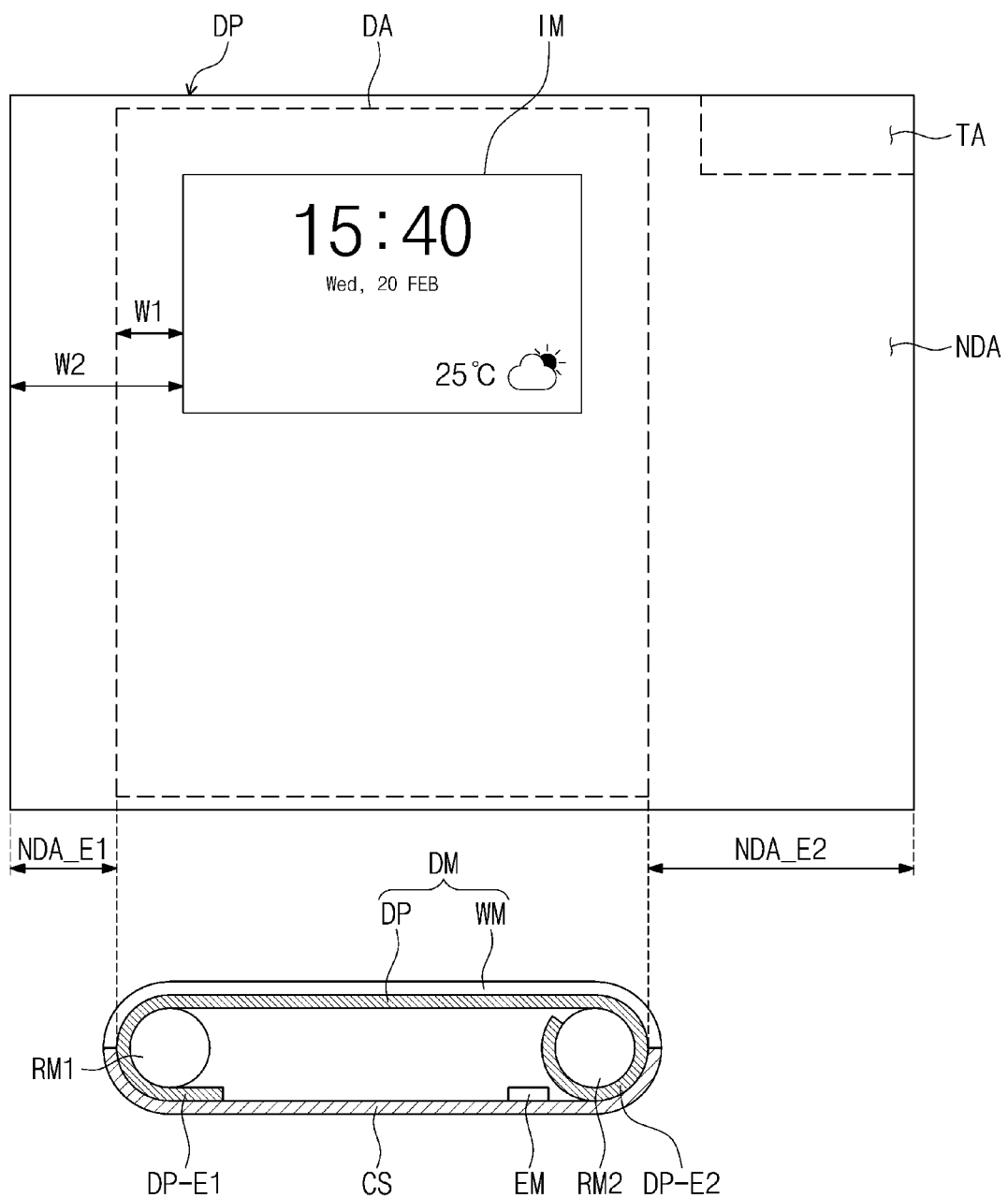
FIGS. 13 and 14 illustrate a display panel according to an embodiment.
Figure 14:
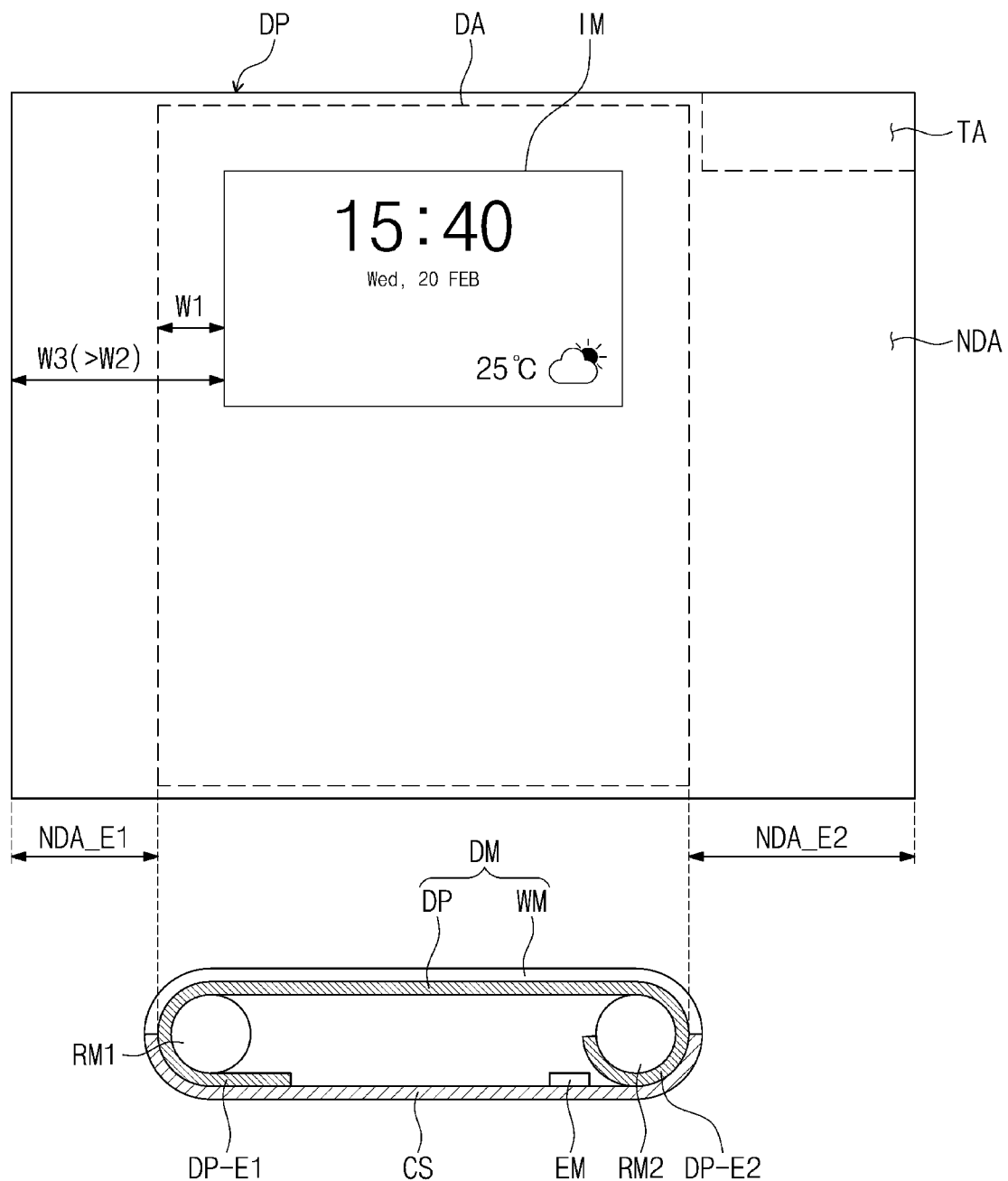

FIGS. 13 and 14 illustrate a display panel according to an embodiment.

Referring to FIGS. 13 and 14, an image IM may be displayed in the display region DA of the display panel DP in the first display mode. In an embodiment, the image IM may be a clock, but an embodiment is not limited thereto.

An afterimage of the image previously displayed may remain on the display panel DP when the image IM may be displayed on the display panel DP for a long time and the screen may be switched to a new image. Such an afterimage may cause deterioration of the quality of the display device DD.

In an embodiment, the first roller RM1 and the second roller RM2 may move the display panel DP so that the image IM may be moved and displayed. The first and second rollers RM1 and RM2 may move, for example, at certain intervals. The controller CM (see FIG. 3) may allow the first roller RM1 and the second roller RM2 to rotate in the clockwise and counterclockwise directions at the intervals so that the display panel DP may be moved.

The position of the display region DA may move on the display panel DP as the first roller RM1 and the second roller RM2 rotate in the clockwise and counterclockwise directions.

As shown in FIG. 13, the first roller RM1 and the second roller RM2 may move in the clockwise direction by a rotation distance. As shown in FIG. 14, the first roller RM1 and the second roller RM2 may move in the counterclockwise direction by a rotation distance.

As shown in FIG. 13 and FIG. 14, the display position of the image IM in the display region DA may not be changed even when the first roller RM1 and the second roller RM2 rotate in the clockwise and counterclockwise directions. In other words, a first distance W1 between the display region DA and the image IM may be the same even if the first roller RM1 and the second roller RM2 rotate, as shown in FIGS. 13 and 14.

In contrast, a second distance W2 from the end of the first end portion DP-E1 of the display panel DP to the image IM in FIG. 13 may be smaller than a third distance W3 from the end of the first end portion DP-E1 of the display panel DP to the image IM in FIG. 14.

That is, because the position of the display region DA may move on the display panel DP as the first roller RM1 and the second roller RM2 may rotate in the clockwise and counterclockwise directions, the position of the image IM on the display panel DP may be changed.

Accordingly, a deterioration phenomenon such as an afterimage on a screen may be prevented from occurring when the image IM is displayed for a long time at the same position.

Generally, it may be in the first display mode that an image IM may be displayed for a long time. Accordingly, the rotation distance of the first roller RM1 and the second roller RM2 may be set within a range in which the transparent region TA may not be exposed to the outside. But, the embodiments thereof are not limited thereto. For example, even in the second display mode, the first roller RM1 and the second roller RM2 may rotate in the clockwise and counterclockwise directions at certain intervals to move the display panel DP.

Movement of the display panel DP as illustrated in FIGS. 13 and 14 may be performed in a non-light emitting mode of the display panel DP. For example, when a user does not use the display device for a time period, the display panel DP may become in the non-light emitting mode. At this time, the first roller RM1 and the second roller RM2 may rotate in the clockwise and counterclockwise directions at the intervals to move the display panel DP. Accordingly, a user may not sense the movement of the image IM when the display panel DP is moved to prevent deterioration of the display panel DP.

Figure 15:
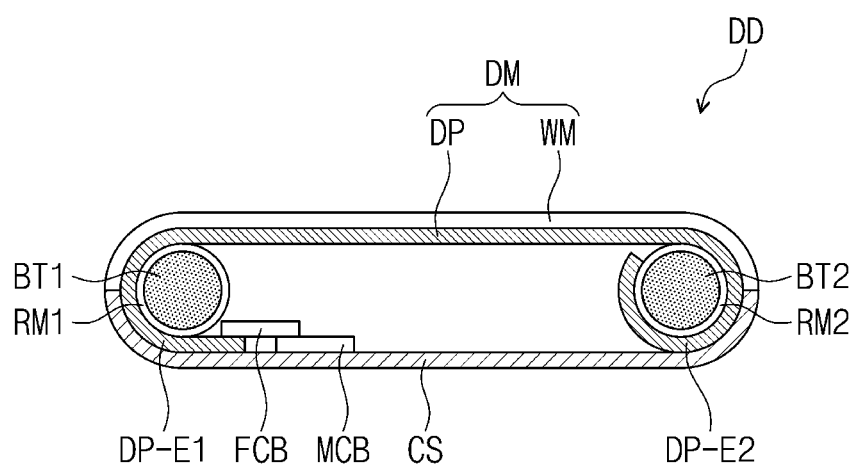
FIG. 15 is a schematic cross-sectional view taken along line I-I' of the display device illustrated in FIG. 1 according to an embodiment.
Figure 15:
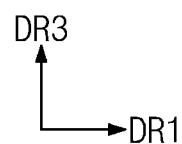

FIG. 15 is a schematic cross-sectional view taken along line I-I' of the display device illustrated in FIG. 1 according to an embodiment.

A display device DD may include a first battery BT1 inside the first roller RM1 and a second battery BT2 inside the second roller RM2. The first battery BT1 and the second battery BT2 may be included in the power supply PM illustrated in FIG. 3. The first battery BT1 and the second battery BT2 may be cylindrical. The display device DD may include the two batteries BT1 and BT2 in an embodiment. But, the embodiments thereof are not limited thereto. The display device DD may include only one of the first battery BT1 and the second battery BT2.

The size of the display device DD may be minimized by providing the first battery BT1 and the second battery BT2 inside the first roller RM1 and the second roller RM2, respectively.

The display device having the configuration described above may provide a relatively wide display region and a relatively narrow non-display region. The display device may prevent deterioration of the display panel by periodically moving the display panel.

By including a battery inside the roller, the size of the display device may be reduced or minimized.

Although the embodiments have been described herein, it is understood that various changes and modifications can be made by those skilled in the art within the spirit and scope of the disclosure defined by the following claims or the equivalents.

Therefore, the scope of the disclosure is defined by the following claims or the equivalents other than the foregoing detailed description.

What is claimed is:

1. A display device comprising:
a rollable display panel comprising a first end portion and a second end portion spaced apart from the first end portion;
a first roller configured to roll the first end portion;
a second roller configured to roll the second end portion, and
a camera module, wherein
the second end portion of the rollable display panel comprises a transmissive region which external light passes through,
the camera module and the rollable display panel overlap each other, and the transmissive region ion and the camera module overlap each other in a first display mode.

2. The display device of claim 1, wherein
the second end portion of the rollable display panel is rolled by the second roller in a second display mode, and
the transmissive region of the second end portion is not exposed outside the display device in the second display mode.

3. The display device of claim 1, wherein
the first end portion of the rollable display panel is rolled by the first roller in the first display mode, and
the transmissive region of the second end portion is exposed to outside the display device in the first display mode.

4. The display device of 1, wherein the first display mode is an operation mode of the camera module.

5. The display device of claim 1, wherein the camera module comprises at least one of a light emitting element and a photo sensor.

6. The display device of claim 1, wherein the rollable display panel comprises pixels, wherein the transmissive region does not comprise any of the pixels.

7. The display device of claim 1, further comprising a case configured to accommodate the rollable display panel, the first roller, and the second roller.

8. The display device of claim 7, further comprising an electronic part disposed inside the case, wherein the electronic part and the rollable display panel overlap each other.

9. The display device of claim 7, wherein the rollable display panel comprises:

a display region exposed in a front direction of the case; and a non-display region adjacent to the display region.

10. The display device of claim 8, wherein the first roller and the second roller rotate in a clockwise direction or a counterclockwise direction to move the rollable display panel in the clockwise direction or the counterclockwise direction.

11. The display device of claim 10, wherein the first roller and the second roller rotate in the clockwise direction or the counterclockwise direction within a range in which the transmissive region of the second end portion is not exposed outside the display device.

12. The display device of claim 10, wherein the first roller and the second roller rotate in the clockwise direction or the counterclockwise direction in a non-light emitting mode of the rollable display panel.

13. The display device of claim 10, wherein a position of a display region in the rollable display panel changes in accordance with a rotation direction and a rotation distance when the first roller and the second roller rotate in the clockwise direction or the counterclockwise direction.

14. The display device of claim 1, wherein a first radius of rotation of the first roller and a second radius of rotation of the second roller are equal to each other.

15. The display device of claim 1, further comprising a power supply disposed inside at least one of the first roller or the second roller.

16. The display device of claim 1, further comprising:
a first board connected to the first end portion of the rollable display panel; and
a second board electrically connected to the first board.

17. An operation method of a display device comprising a rollable display panel comprising a first end portion and a second end portion which is spaced apart from the first end portion and includes a transmissive region, the operation method comprising:
determining an operation mode;
rolling the rollable display panel in a first rotation direction so that the transmissive region is not exposed outside the display device in a first display mode;
rolling the rollable display panel in a second rotation direction so that the transmissive region is exposed outside the display device in a second display mode; and
displaying an image in a display region of the rollable display panel, the display region being exposed outside the display device, wherein
the display device further comprises a camera module, and
the camera module and the transmissive region of the rollable display panel overlap each other in the second display mode.

18. The operation method of claim 17, further comprising rotating the rollable display panel in the first rotation direction or the second rotation direction in a non-light emitting mode of the rollable display panel.

\* \* \* \* \*